United States Patent
Dede et al.

(10) Patent No.: US 11,545,297 B2
(45) Date of Patent: Jan. 3, 2023

(54) FUNCTIONALLY GRADED THERMAL VIAS FOR INDUCTOR WINDING HEAT FLOW CONTROL

(71) Applicants: Toyota Motor Engineering & Manufacturing North America, Inc., Plano, TX (US); University of Colorado Boulder, Boulder, CO (US)

(72) Inventors: Ercan Dede, Ann Arbor, MI (US); Yucheng Gao, Boulder, CO (US); Vivek Sankaranarayanan, Boulder, CO (US); Aritra Ghosh, Boulder, CO (US); Robert Erickson, Boulder, CO (US); Dragan Maksimovic, Boulder, CO (US)

(73) Assignees: TOYOTA MOTOR ENGINEERING & MANUFACTURING NORTH AMERICA, INC., Plano, TX (US); UNIVERSITY OF COLORADO BOULDER, Boulder, CO (US)

(*) Notice: Subject to any disclaimer, the term of this patent is extended or adjusted under 35 U.S.C. 154(b) by 515 days.

(21) Appl. No.: 16/692,653

(22) Filed: Nov. 22, 2019

(65) Prior Publication Data
US 2020/0388432 A1 Dec. 10, 2020

Related U.S. Application Data

(60) Provisional application No. 62/857,973, filed on Jun. 6, 2019.

(51) Int. Cl.
*H05K 1/02* (2006.01)
*H01F 27/28* (2006.01)
(Continued)

(52) U.S. Cl.
CPC ......... *H01F 27/2876* (2013.01); *H01F 27/24* (2013.01); *H01F 27/2804* (2013.01);
(Continued)

(58) Field of Classification Search
CPC .............. H01F 27/2876; H05K 1/0206; H05K 2201/066
See application file for complete search history.

(56) References Cited

U.S. PATENT DOCUMENTS 6,518,868 B1  2/2003  Miller et al.
7,088,215 B1*  8/2006  Winter .................. H05K 1/165
                                                    336/200

(Continued)

FOREIGN PATENT DOCUMENTS

CN        107610903 A    1/2018
WO        2014/141674 A1  9/2014

*Primary Examiner* — Sherman Ng
(74) *Attorney, Agent, or Firm* — Dinsmore & Shohl LLP (57) ABSTRACT

Embodiments of the disclosure relate to apparatuses for enhanced thermal management of an inductor assembly using functionally-graded thermal vias for heat flow control in the windings of the inductor. In one embodiment, a PCB for an inductor assembly includes a top surface and a bottom surface. Two or more electrically-conductive layers are embedded within the PCB and stacked vertically between the top surface and the bottom surface. The two or more electrically-conductive layers are electrically connected to form an inductor winding. A plurality of thermal vias thermally connects each of the two or more electrically-conductive layers to a cold plate thermally connected to the bottom surface. A number of thermal vias thermally connecting each electrically-conductive layer to the cold plate is directly proportional to a predetermined rate of heat dissipation from the electrically-conductive layer.

19 Claims, 6 Drawing Sheets

(51) Int. Cl.
*H05K 1/16* (2006.01)
*H05K 1/11* (2006.01)
*H01F 27/24* (2006.01)

(52) U.S. Cl.
CPC ........... *H05K 1/0206* (2013.01); *H05K 1/115* (2013.01); *H05K 1/165* (2013.01); *H01F 2027/2809* (2013.01); *H05K 2201/066* (2013.01); *H05K 2201/09609* (2013.01)

(56) References Cited

U.S. PATENT DOCUMENTS

| | | |
|---|---|---|
| 8,466,769 B2 | 6/2013 | Dalmia et al. |
| 9,337,797 B2 | 5/2016 | Muto |
| 10,199,159 B2 | 2/2019 | Nakajima et al. |
| 10,834,825 B1 * | 11/2020 | Bedinger ............. H05K 3/0047 |
| 2005/0047094 A1 * | 3/2005 | Hsu .................. H01L 23/49827 |
| | | 257/E23.102 |
| 2006/0109632 A1 * | 5/2006 | Berlin .................. H05K 1/0206 |
| | | 257/E23.105 |
| 2006/0152911 A1 * | 7/2006 | Humbert ................. H01L 23/50 |
| | | 361/783 |
| 2008/0217708 A1 * | 9/2008 | Reisner ............... H03H 9/0547 |
| | | 257/E21.003 |
| 2009/0002950 A1 * | 1/2009 | Gertiser ................. H05K 7/205 |
| | | 361/709 |
| 2017/0338025 A1 | 11/2017 | Benzerrouk |
| 2018/0317313 A1 | 11/2018 | Kegeler |
| 2019/0019618 A1 | 1/2019 | Fukui et al. |
| 2019/0313522 A1 * | 10/2019 | Trulli .................. H05K 1/0271 |

* cited by examiner

FUNCTIONALLY GRADED THERMAL VIAS FOR INDUCTOR WINDING HEAT FLOW CONTROL

CROSS-REFERENCE TO RELATED APPLICATIONS

This application claims priority to U.S. Provisional Patent Application No. 62/857,973 entitled "Functionally Graded Electro-Thermal Vias for Inductor Winding Heat Flow Control" and filed on Jun. 6, 2019, which is hereby incorporated by reference in its entirety.

STATEMENT OF GOVERNMENT INTEREST

The subject matter of the present disclosure was developed with government support under Department of Energy Cooperative Agreement Award Number DE-AR0000897 awarded by the Advanced Research Projects Agency of the U.S. Department of Energy. Accordingly, the government has certain rights in the subject matter of the present disclosure.

TECHNICAL FIELD

Embodiments of the disclosure generally relate to a cooling mechanism for electronics applications and, more specifically, to apparatuses for enhanced thermal management of an inductor assembly using functionally-graded thermal vias for heat flow control in the windings of the planar inductor.

BACKGROUND

An inductor is an electromagnetic component used to store energy in a magnetic field when electric current is passed through its electrical coil. In a planar inductor, the coil may be a flat wound wire, or it may be a winding that is embedded in a printed circuit board (PCB).

In the case of a planar inductor assembly with a winding embedded in a PCB, the heat generated by the PCB winding may be transferred through the bottom surfaces of the PCB to a secondary cold plate to which the PCB is mounted. However, in high power applications, a challenge arises in that the heat generated in the PCB-based winding layers forming the inductor may lead to excessively high temperatures (e.g. greater than 120° C.) that degrade the working properties of the inductor assembly. The heat generated in the PCB-based winding layers is on the order of 10's of Watts and sometimes more than 50 Watts. Since the PCB is formed using a low thermal conductivity material such as a glass-reinforced epoxy laminate (FR-4), there is no low-thermal-resistance heat flow path to dissipate the generated heat from the different winding layers, especially the winding layers proximate to the top surface of the PCB. Accordingly, it is desirable to have an enhanced thermal management solution for the inductor assembly designed to help dissipate the heat generated in the winding layers and guide it to the secondary cold plate such that the inductor can continue to work efficiently and reliably over its lifetime.

SUMMARY

Embodiments of the disclosure relate to apparatuses for enhanced thermal management of an inductor assembly using functionally-graded thermal vias for heat flow control in the windings of the inductor. In one embodiment, a PCB for an inductor assembly includes a top surface and a bottom surface. Two or more electrically-conductive layers are embedded within the PCB and stacked vertically between the top surface and the bottom surface. The two or more electrically-conductive layers are electrically connected to form an inductor winding. A plurality of thermal vias thermally connects each of the two or more electrically-conductive layers to a cold plate thermally connected to the bottom surface. A number of thermal vias thermally connecting each electrically-conductive layer to the cold plate is directly proportional to a predetermined rate of heat dissipation from the electrically-conductive layer.

In another embodiment, an inductor assembly includes a cold plate having a slotted recess and a first inductor core mounted to the cold plate through the slotted recess along a first end of the first inductor core. The inductor assembly further includes a PCB disposed over the cold plate. The PCB has a top surface and a bottom surface thermally connected to the cold plate. Two or more electrically-conductive layers are embedded within the PCB and stacked vertically between the top surface and the bottom surface. The two or more electrically-conductive layers are electrically connected to form an inductor winding. A plurality of thermal vias thermally connects each of the two or more electrically-conductive layers to the cold plate. A number of thermal vias thermally connecting each electrically-conductive layer to the cold plate is directly proportional to a predetermined rate of heat dissipation from the electrically-conductive layer.

These and additional features provided by the embodiments described herein will be more fully understood in view of the following detailed description, in conjunction with the drawings.

BRIEF DESCRIPTION OF THE DRAWINGS

The embodiments set forth in the drawings are illustrative and exemplary in nature and not intended to limit the subject matter defined by the claims. The following detailed description of the illustrative embodiments can be understood when read in conjunction with the following drawings, where like structure is indicated with like reference numerals and in which:

DETAILED DESCRIPTION

Embodiments described herein are directed to apparatuses for enhanced thermal management of a planar inductor assembly using thermal vias for heat flow control in the winding of the planar inductor. Such inductor assemblies may be used in composite converter systems found in electric vehicles. Through implementation of a plurality of thermal vias distributed in a non-uniform and functionally-graded manner, an optimally-shaped cold plate and a ceramic shim layer between the PCB and the cold plate, heat produced due to electric current in the windings is effectively dissipated to maintain a desired profile of operating temperature of the inductor assembly. In particular, the plurality of thermal vias connecting different layers of the windings are distributed based on position and a predetermined rate of heat dissipation for each layer to preferentially reduce the temperature of the layer, thereby creating a uniform thermal load profile for the winding. The addition of the ceramic shim layer significantly improves heat dissipation from the PCB and helps maintain the desired temperature profile.

Figure 1A:
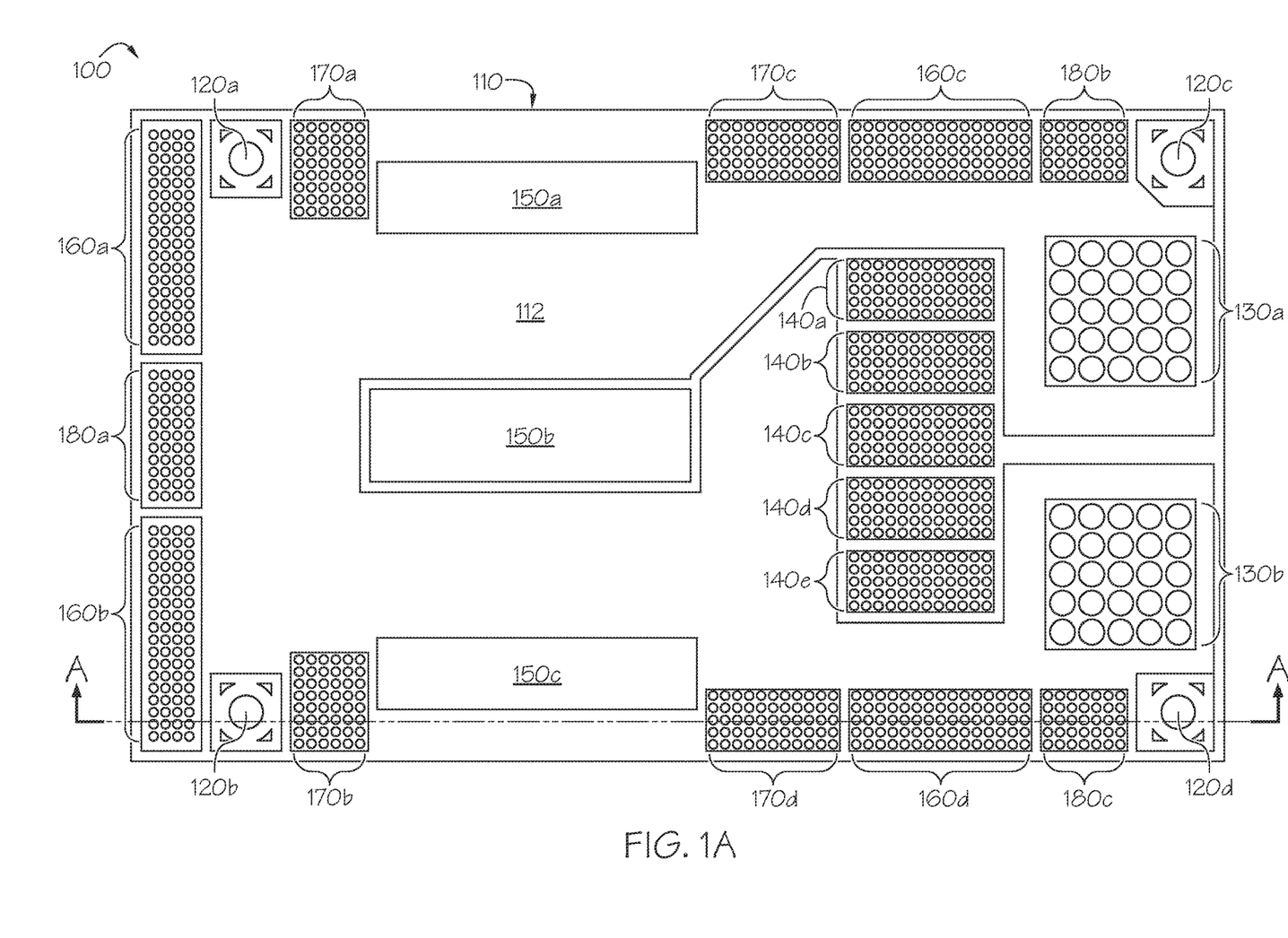
FIG. 1A depicts a top view of a PCB for an inductor assembly, according to one or more embodiments shown and described herein.
Figure 1B:
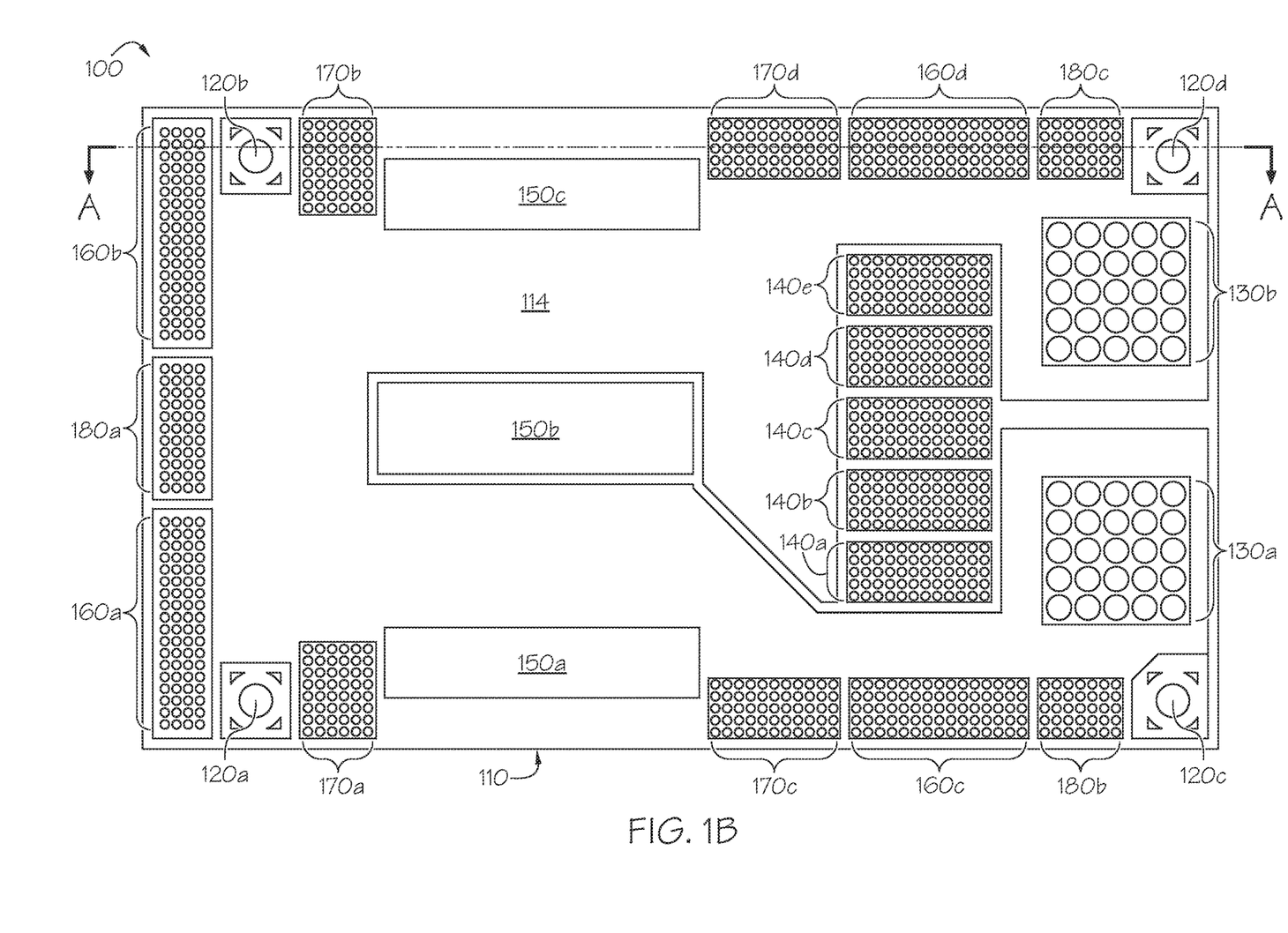
FIG. 1B depicts a bottom view of the PCB of FIG. 1A, according to one or more embodiments shown and described herein.
Figure 2:
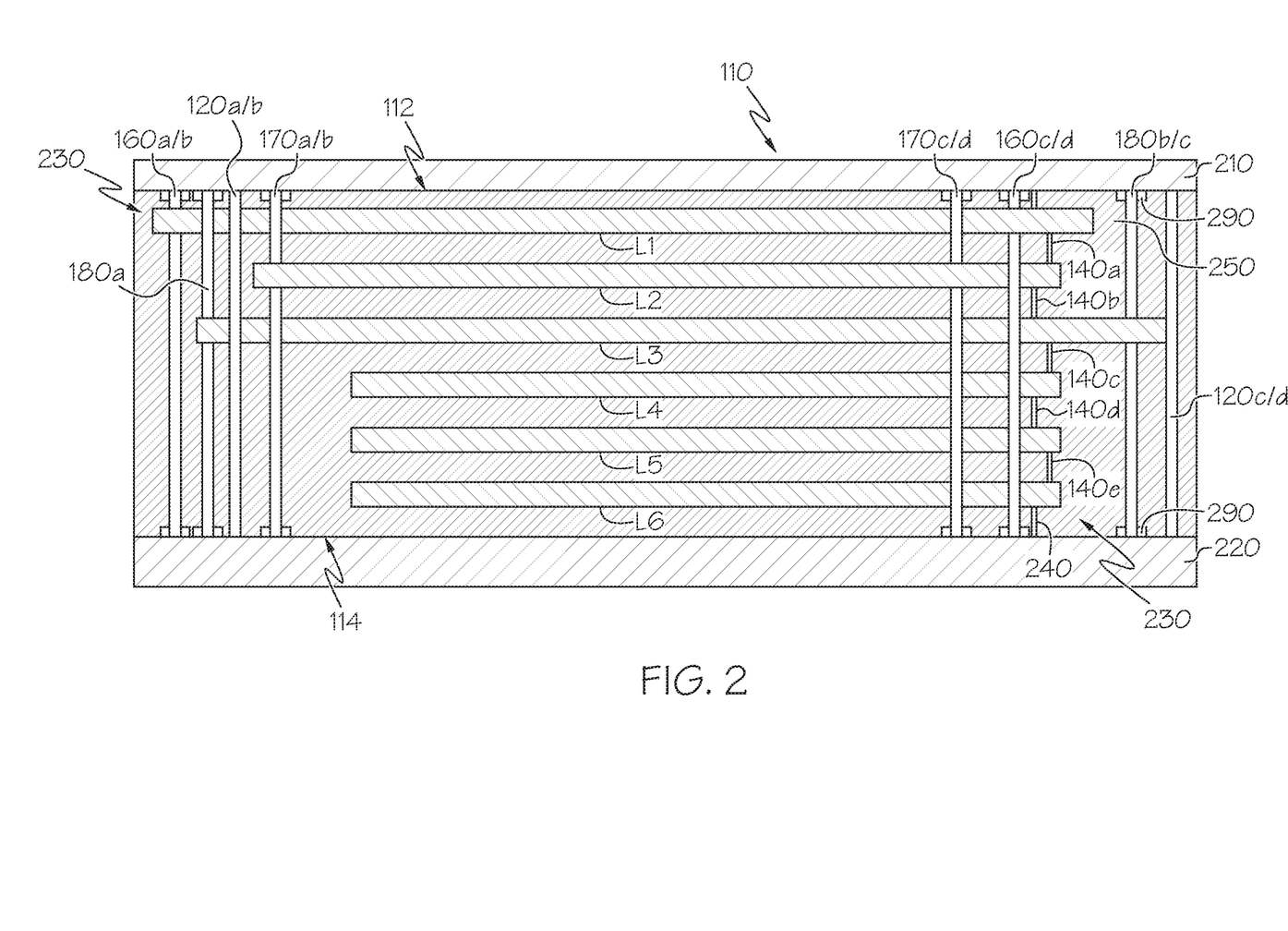
FIG. 2 depicts a cross-sectional side view of the PCB of FIG. 1A, according to one or more embodiments shown and described herein.

FIGS. 1A-1B depict a top view and a bottom view of an example PCB 110 for an example inductor assembly 100 additionally shown in FIGS. 3-4 and described in detail below. FIG. 2 depicts a cross-sectional side view of the example PCB 110 along a cut line A-A shown in FIGS. 1A-1B. The example PCB 110 has a top surface 112 and a bottom surface 114. In the illustrated embodiment of FIG. 2, the example PCB 110 has six electrically-conductive layers L1, L2, L3, L4, L5, and L6 embedded within the example PCB 110 and stacked vertically between the top surface 112 and the bottom surface 114. The six electrically-conductive layers L1, L2, L3, L4, L5, and L6 are formed from an electrically conductive material such as, but not limited to, copper or aluminum. The electrically-conductive layers L1, L2, L3, L4, L5, and L6 are electrically connected to form an inductor winding 230 of the inductor assembly 100. The electrically-conductive layers L1, L2, L3, L4, L5, and L6 have a minimum width for reducing electrical resistance and enabling the flow of electric current therethrough. While in the specific embodiment shown in FIG. 2, the inductor winding 230 includes six electrically-conductive layers L1, L2, L3, L4, L5, and L6 electrically connected together, in other embodiments, the inductor winding 230 need only have two or more electrically-conductive layers electrically connected together.

The example PCB 110 has four through-holes 120a, 120b, 120c, and 120d located at or near the corners of the example PCB 110. The through-holes 120a, 120b, 120c, and 120d are configured to mechanically couple the example PCB 110 to the inductor assembly 100. The example PCB 110 is, however, not limited to having four through-holes 120a, 120b, 120c, and 120d for mechanical coupling to the inductor assembly 100 and may contain, in other embodiments, any number of through-holes sufficient for that purpose.

Figure 4:
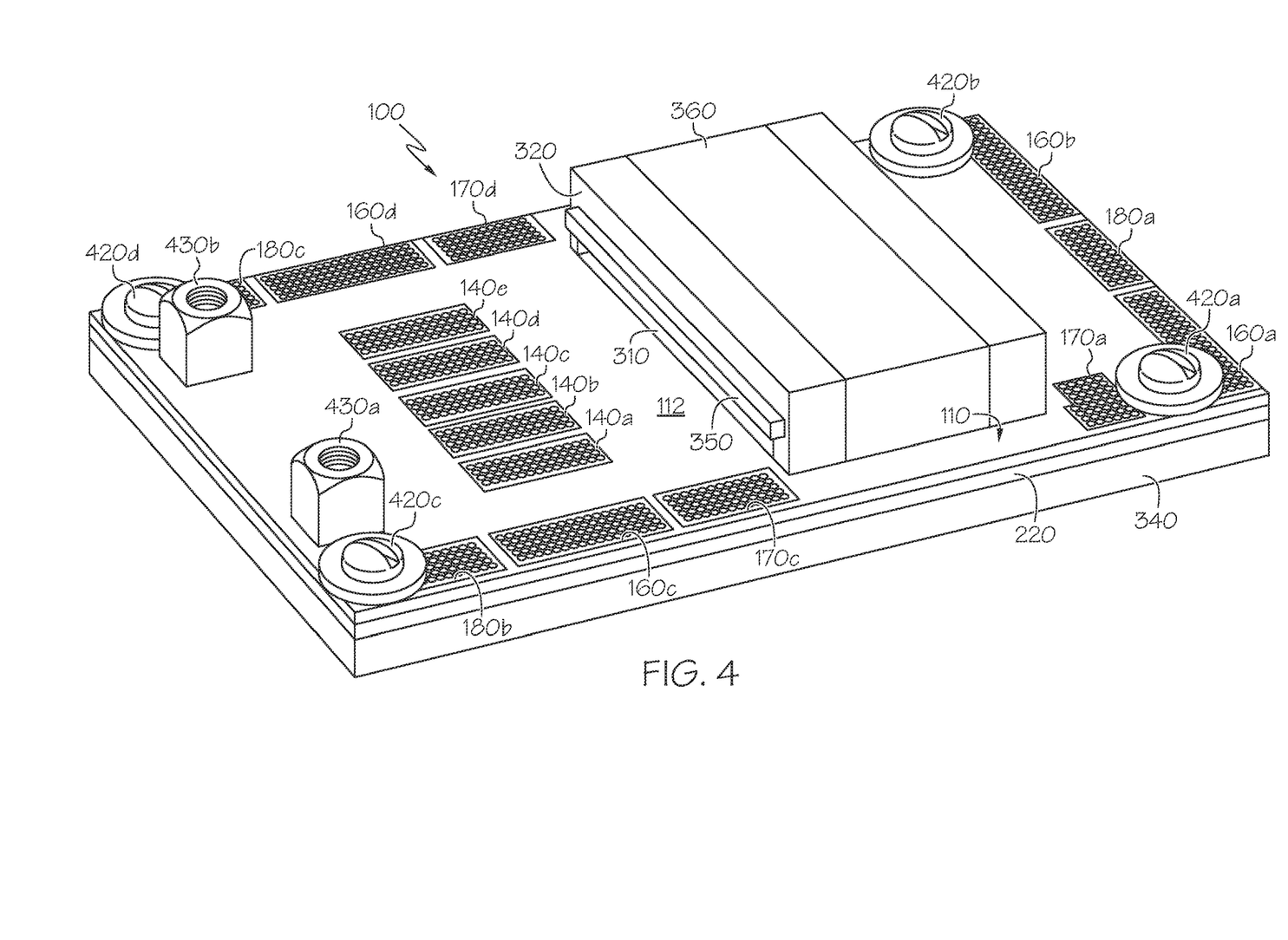
FIG. 4 depicts an isometric view of the inductor assembly of FIG. 3, according to one or more embodiments shown and described herein.

The example PCB 110 has two sets of through-holes 130a and 130b for accommodating pins of two electrical connectors 430a and 430b shown in FIG. 4. The two electrical connectors 430a and 430b are configured to externally connect the electrically-conductive layers L1, L2, L3, L4, L5, and L6 embedded within the example PCB 110. The example PCB 110 is, however, not limited to having two sets of through-holes 130a and 130b for externally connecting the electrically-conductive layers L1, L2, L3, L4, L5, and L6 and may contain, in other embodiments, any number of sets of through-holes sufficient for that purpose. In the illustrated embodiment, the example PCB 110 also has three apertures 150a, 150b, 150c between the top surface 112 and the bottom surface 114 for accommodating an E-type inductor core of the inductor assembly.

The top surface 112 of the example PCB 110 is layered with a solder mask 210 as shown in FIG. 2, except in areas where circuit elements are soldered. In some embodiments, the solder mask 210 comprises an electrically-isolating material such as an epoxy resin. The electrically-conductive layers L1, L2, L3, L4, L5, and L6 forming the inductor winding 230 are held together by prepreg (pre-impregnated) layers 250 (collectively). In some embodiments, the prepreg layers 250 are formed from fiberglass impregnated with an epoxy resin (for example, a glass-reinforced epoxy laminate like FR-4) having low thermal conductivity. The prepreg layers 250 electrically and thermally isolate the electrically-conductive layers L1, L2, L3, L4, L5, and L6.

The example PCB 110 includes five sets of electro-thermal vias—140a, 140b, 140c, 140d, and 140e, as additionally shown in FIG. 2. The electro-thermal vias are plated through-holes having electrically-conductive surfaces (for example, made of copper) within for maintaining an electrical connection therethrough. Each set of the electro-thermal vias 140a, 140b, 140c, 140d, and 140e electrically interconnect any two of the electrically-conductive layers L1, L2, L3, L4, L5, and L6 embedded within the example PCB 110. Each set of the electro-thermal vias 140a, 140b, 140c, 140d, and 140e are also thermally connected to the bottom surface 114 of the example PCB 110. As referred herein, "thermally connected" means a direct or indirect connection between two surfaces that allows the exchange of heat between the two surfaces. The example PCB 110 is, however, not limited to having five sets of electro-thermal vias 140a, 140b, 140c, 140d, and 140e and may contain, in other embodiments, any number of sets of electro-thermal vias sufficient to electrically interconnect any two of the electrically-conductive layers L1, L2, L3, L4, L5, and L6 embedded within the example PCB 110.

In the illustrated embodiment shown in FIG. 2, the set of electro-thermal vias 140a electrically connect the electrically-conductive layers L1 and L2; the set of electro-thermal vias 140b electrically connect the electrically-conductive layers L2 and L3; the set of electro-thermal vias 140c electrically connect the electrically-conductive layers L3 and L4; the set of electro-thermal vias 140d electrically connect the electrically-conductive layers L4 and L5; and the set of electro-thermal vias 140e electrically connect the electrically-conductive layers L5 and L6. The electro-thermal vias 140a, 140b, 140c, 140d, and 140e are thermally connected to the bottom surface 114 of the example PCB 110 through a conduit 240.

The example PCB 110 further includes a plurality of thermal vias T (for example, sets of thermal vias are shown as 160a, 160b, 160c, 160d, 170a, 170b, 170c, 170d, 180a, 180b, and 180c in FIGS. 1A-1B and FIG. 2) distributed along one or more edges on the top surface 112 of the example PCB 110. A set of vias, as used herein, is defined as including many individual vias clustered together. FIG. 2 shows only a single representative thermal via for each set of thermal vias. Thermal vias are metal-plated through-holes having thermally conductive interiors for maintaining a thermal connection therethrough. The plurality of thermal vias T thermally connect one or more of the electrically-conductive layers L1, L2, L3, L4, L5, and L6 to the bottom surface 114, which may be thermally connected to a heat sink such as, but not limited to, a cold plate 340 shown in FIGS. 3-4 and described in detail below. Since the electrically-conductive layers L1, L2, L3, L4, L5, and L6 forming the inductor winding 230 have a minimum width, as noted above, the plurality of thermal vias T are positioned outside of the inductor winding 230 and are electrically isolated therefrom. Each of the plurality of thermal vias T does not intersect any of the electrically-conductive layers L1, L2, L3, L4, L5, and L6 except the electrically-conductive layer that it connects to.

In the illustrated embodiment shown in FIG. 2, four sets of thermal vias 160a, 160b, 160c, 160d thermally connect the electrically-conductive layer L1 to the bottom surface 114; four sets of thermal vias 170a, 170b, 170c, 170d thermally connect the electrically-conductive layer L2 to the bottom surface 114; and three sets of thermal vias 180a, 180b, 180c thermally connect the electrically-conductive layer L3 to the bottom surface 114. The example PCB 110 is, however, not limited to having eleven sets of thermal vias 160a, 160b, 160c, 160d, 170a, 170b, 170c, 170d, 180a, 180b, and 180c and may contain, in other embodiments, any number of sets of thermal vias assigned to each of the electrically-conductive layers L1, L2, L3, L4, L5, and L6. The eleven sets of thermal vias 160a, 160b, 160c, 160d, 170a, 170b, 170c, 170d, 180a, 180b, and 180c physically contact the top surface 112 and the bottom surface 114 of the example PCB 110 through pads 290. While in the specific embodiment shown in FIG. 2, the sets of thermal vias 160a, 160b, 160c, 160d, 170a, 170b, 170c, 170d, 180a, 180b, and 180c thermally connect only the three electrically-conductive layers L1, L2, and L3 consecutively proximate to the top surface 112, in other embodiments, the plurality of thermal vias T may thermally connect any number of the electrically-conductive layers L1, L2, L3, L4, L5, and L6 to the bottom surface 114.

The eleven sets of thermal vias 160a, 160b, 160c, 160d, 170a, 170b, 170c, 170d, 180a, 180b, and 180c are distributed in a non-uniform and functionally-graded manner based on a desired temperature profile of each of the electrically-conductive layers L1, L2, L3, L4, L5, and L6 to which they thermally connect. In the illustrated embodiment of FIG. 2, the electrically-conductive layer L1 is the most proximate to the top surface 112 and the least proximate to the bottom surface 114, which is thermally connected to the cold plate 340 used for dissipating the heat produced during operation of the inductor assembly 100. Similarly, the electrically-conductive layer L2 is less proximate to the top surface 112 and more proximate to the bottom surface 114 than the electrically-conductive layer L1, the electrically-conductive layer L3 is less proximate to the top surface 112 and more proximate to the bottom surface 114 than the electrically-conductive layers L1 and L2, and so forth.

When heat is produced during operation of the inductor assembly 100 by an electric current flowing through the electrically-conductive layers L1, L2, L3, L4, L5, and L6, the heat generated in the electrically-conductive layer L1 is the highest due to additional current generated due to fringing electromagnetic fields. Moreover, the heat in the electrically-conductive layer L1 is farther away from the cold plate 340 than the electrically-conductive layers L2, L3, L4, L5, and L6. This means that the heat from the electrically-conductive layer L1 must traverse the longest heat flow path (and hence overcome the highest thermal resistance) through the prepreg layers 250 and the electrically-conductive layers L2, L3, L4, L5, and L6 before being dissipated through the cold plate 340. Similarly, the heat from the electrically-conductive layer L2 is also substantial due to additional current generated due to fringing electromagnetic fields and must traverse a longer heat flow path (and hence overcome a higher thermal resistance) than that from the electrically-conductive layers L3, L4, L5, and L6, though the heat flow path from the electrically-conductive layer L2 to the cold plate 340 is shorter (and hence overcomes lower thermal resistance) than from the electrically-conductive layer L1. Following this pattern, the electrically-conductive layer L6 is the least proximate to the top surface 112 and the most proximate to the bottom surface 114, which means that the heat from the electrically-conductive layer L6 has the shortest heat flow path and overcomes the lowest thermal resistance before being dissipated through the cold plate 340.

The number of thermal vias thermally connecting each of the electrically-conductive layers L1, L2, L3, L4, L5, and L6 to the cold plate 340 is directly proportional to a predetermined rate of heat dissipation from the respective electrically-conductive layer. In other words, since the electrically-conductive layers L1, L2, L3, L4, L5, and L6 encounter progressively shorter heat flow paths and overcome progressively lower thermal resistance depending on proximity to the bottom surface 114, the plurality of thermal vias T for thermally connecting each of the electrically-conductive layers L1, L2, L3, L4, L5, and L6 is functionally allocated based on the heat dissipation requirements of each of the electrically-conductive layers L1, L2, L3, L4, L5, and L6, in order to create a uniform thermal load profile for the inductor winding 230 and reduce the overall temperature of the inductor assembly 100. To create and maintain a uniform thermal load profile for the inductor winding 230, the heat dissipated from the electrically-conductive layer L1 is thus higher in magnitude than the heat dissipated from the electrically-conductive layer L2, which is higher in magnitude than the heat dissipated from the electrically-conductive layer L3, and so on and follow predetermined rates of heat dissipation to remove heat from each of the electrically-conductive layers L1, L2, L3, L4, L5, and L6 during the same period of time. In non-limiting examples, the predetermined rates of heat dissipation from each of the electrically-conductive layers L1, L2, L3, L4, L5, and L6 have a range between about 5 Joules and about 15 Joules per second.

Accordingly, the electrically-conductive layer L1 is allocated a higher number of thermal vias than the electrically-conductive layer L2, in order to preferentially cool the electrically-conductive layer L1 more than the electrically-conductive layer L2. Similarly, the electrically-conductive layer L2 is allocated a higher number of thermal vias than the electrically-conductive layer L3, in order to preferentially cool the electrically-conductive layer L2 more than the electrically-conductive layer L3, and so forth. For example, the total number of thermal vias in the four sets of thermal vias 160a, 160b, 160c, 160d thermally connecting the electrically-conductive layer L1 to the bottom surface 114 may be three hundred (300); the total number of thermal vias in the four sets of thermal vias 170a, 170b, 170c, 170d thermally connecting the electrically-conductive layer L2 to the bottom surface 114 may be two hundred (200); and the total number of thermal vias in the three sets of thermal vias 180a, 180b, 180c thermally connecting the electrically-conductive layer L3 to the bottom surface 114 may be one hundred and twenty (120).

This principle of distribution of the plurality of thermal vias T thus leads to an electrically-conductive layer relatively proximate to the top surface 112 having a greater number of thermal vias than an electrically-conductive layer relatively proximate to the bottom surface 114. In different embodiments, the distribution of the plurality of thermal vias for each of the electrically-conductive layers L1, L2, L3, L4, L5, and L6 may be less or more than the illustrated embodiment above in order to optimize the rate of heat dissipation from the respective electrically-conductive layer for creating a uniform thermal load profile thereof.

The inductor assembly 100 can be reliably operated by maintaining a desired temperature profile for each of the electrically-conductive layers L1, L2, L3, L4, L5, and L6 in the inductor winding 230. A simple rule of thumb followed by high-temperature PCBs for maintaining a uniform thermal load profile is to have an operating temperature of 25° C. below the glass transition temperature of the high-temperature PCBs, which typically is at least 170° C. Thus, high-temperature PCBs, such as the example PCB 110 should have an operating temperature of no more than 145° C. for reliable operation. In order to create a uniform thermal load profile and maintain the example PCB 110 at an operating temperature of no more than 145° C., each of the electrically-conductive layers L1, L2, L3, L4, L5, and L6 should have a predetermined rate of heat dissipation that depends, among other factors, on the heat produced due to flow of electrical current in the respective electrically-conductive layer (known as Joule heating). Since the heat produced by electric current in each of the electrically-conductive layers L1, L2, L3, L4, L5, and L6 varies, so does the predetermined rate of heat dissipation for the respective electrically-conductive layer. Accordingly, the plurality of thermal vias T is distributed for each of the electrically-conductive layers L1, L2, L3, L4, L5, and L6.

In addition to the plurality of thermal vias, the example PCB 110 includes a shim layer 220 for electrically isolating the example PCB 110. The shim layer 220 is coupled to the bottom surface 114 and is thus thermally connectable to a heat sink such as the cold plate 340. In some embodiments, the shim layer 220 may be formed from a ceramic material (aluminum oxide having a thermal conductivity of 24 W/m*K) for improving the thermal conduction between the example PCB 110 and the heat sink. In some embodiments, the shim layer 220 has a thermal conductivity of at least 20 W/m*K. The shim layer 220 may be coated with thermal grease to further enhance heat transfer between the cold plate 340 and the example PCB 110.

Figure 3:
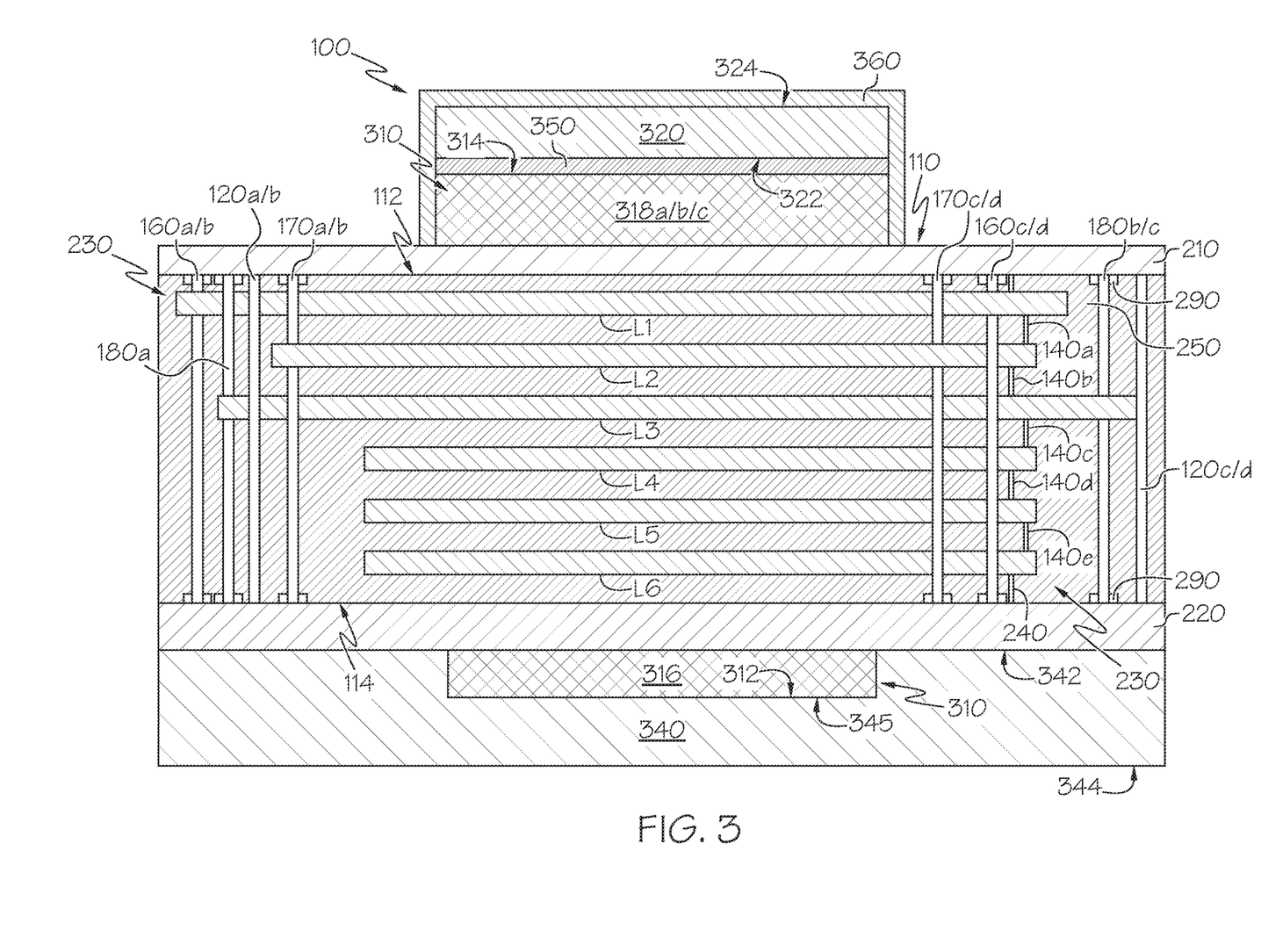
FIG. 3 depicts a cross-sectional side view of an inductor assembly including the PCB of FIG. 1A, according to one or more embodiments shown and described herein.

FIGS. 3-4 depict a cross-sectional side view and an isometric view of the example inductor assembly 100 including the example PCB 110. The inductor assembly 100 further includes a first inductor core 310, and a second inductor core 320 disposed on the first inductor core 310. In the example inductor assembly 100 shown in FIGS. 3-4, the first inductor core 310 is E-shaped and the second inductor core 320 is I-shaped. The first inductor core 310 has a base 316 at a first end 312, and three legs 318a, 318b, and 318c on the base 316 at a second end 314 opposite to the first send 312. In other embodiments, both the first inductor core 310 and the second inductor core 320 may be E-shaped. The first inductor core 310 and the second inductor core 320 are made of a ferrite material such as, but not limited to, iron, an iron alloy, or a magnetic material like manganese-zinc ferrite (Mn—Zn ferrite).

The inductor assembly 100 includes the cold plate 340 having a top surface 342, a bottom surface 344 and a slotted recess 345 therebetween. The cold plate 340 is an optimally-shaped thermally-conductive metal block comprising copper or aluminum. The cold plate 340 is configured to dissipate heat generated in the inductor assembly 100 and may have different shapes and sizes in different embodiments. In some embodiments (not shown), the cold plate 340 may include two pieces—a copper block having the slotted recess 345 disposed over a rectangular block of aluminum or copper, where the copper block is optimally-shaped to reduce the thermal resistance between the example PCB 110 and the rectangular block.

The slotted recess 345 in the cold plate 340 is shaped to facilitate mounting of an inductor core of the inductor assembly 100. In the illustrative embodiment shown in FIGS. 3-4, the slotted recess 345 is shaped as a rectangular notch, though in other embodiments it may be shaped differently. The first inductor core 310 is mounted to the cold plate 340 along the first end 312 such that the base 316 is placed in the slotted recess 345, and the three legs 318a, 318b, and 318c project outwards from the slotted recess 345. The three legs 318a, 318b, and 318c project outwards through the three apertures 150a, 150b, and 150c of the example PCB 110, which is also disposed over the cold plate 340.

The bottom surface 114 of the example PCB 110 is thermally coupled to the top surface 342 of the cold plate 340. While in some embodiments (not shown), the bottom surface 114 is layered with a solder mask, the solder mask from the bottom surface 114 may be removed to improve the thermal conduction, i.e. decrease the thermal resistance between the example PCB 110 and the cold plate 340. In the embodiments shown in FIGS. 3-4, the shim layer 220 is disposed between the example PCB 110 and the cold plate 340 and thus thermally connected to the cold plate 340. In the embodiment shown in FIGS. 3-4, the shim layer 220 has three apertures (not shown) through which the three legs 318a, 318b, and 318c of the first inductor core 310 project outwards. Additionally, the shim layer 220 may be comprised of two rectangular shims on either side of the first inductor core 310 for manufacturing ease to avoid complex ceramic shapes necessitated by the apertures. As shown in FIG. 4, the example PCB 110 is mechanically coupled to the cold plate 340 via four fasteners 420a, 420b, 420c, and 420d each of which passes through the four through-holes 120a, 120b, 120c, and 120d located at or near the corners of the example PCB 110.

A spacer 350 may be disposed on the three legs 318a, 318b, and 318c at the second end 314 of the first inductor core 310. The spacer 350 electrically isolates the first inductor core 310 from the second inductor core 320. The spacer 350 may be formed from any of a variety of electromagnetically neutral materials including, for example, plastics such as polypropylene, polyester, nylon, epoxy and the like, which may be combined with carbon or glass reinforcement. In some embodiments, the spacer 350 is coated with thermal grease to enhance heat transfer between the first inductor core 310 and the second inductor core 320.

In the illustrative embodiment shown in FIGS. 3-4, the second inductor core 320 is disposed on the spacer 350. The second inductor core 320 has a bottom surface 322 and a top surface 324. The first inductor core 310 and the second inductor core 320 may be clamped together with thermally-conductive tape 360, which also functions as a heat-spreader by decreasing the thermal resistance between the second inductor core 320 and the cold plate 340. In other embodiments, a heat-spreading bracket fabricated from a material having high thermal conductivity such as, but not limited to, graphite, a metal (for example, aluminum, copper), an alloy, or thermally-enhanced polymer composites, as described in U.S. application Ser. No. 16/692,370 may be used to clamp the first inductor core 310 and the second inductor core 320 together as well as transfer the heat from the second inductor core 320 to the cold plate 340.

During operation of the inductor assembly 100, the heat produced due to electric current in each of the electrically-conductive layers L1, L2, L3, L4, L5, and L6 continually flows through the plurality of thermal vias T (eleven sets of thermal vias 160a, 160b, 160c, 160d, 170a, 170b, 170c, 170d, 180a, 180b, and 180c in FIGS. 1A-1B and FIG. 2) to the bottom surface 114 of the example PCB 110. The plurality of electro-thermal vias (five sets of electro-thermal vias—140a, 140b, 140c, 140d, and 140e in FIG. 2) also aid in continually transferring the heat produced due to electric current in each of the electrically-conductive layers L1, L2, L3, L4, L5, and L6 to the bottom surface 114 of the example PCB 110. The heat is dissipated from the bottom surface 114 first through the shim layer 220 and then through the cold plate 340, both of which have sufficiently high thermal conductivity.

Figure 5:
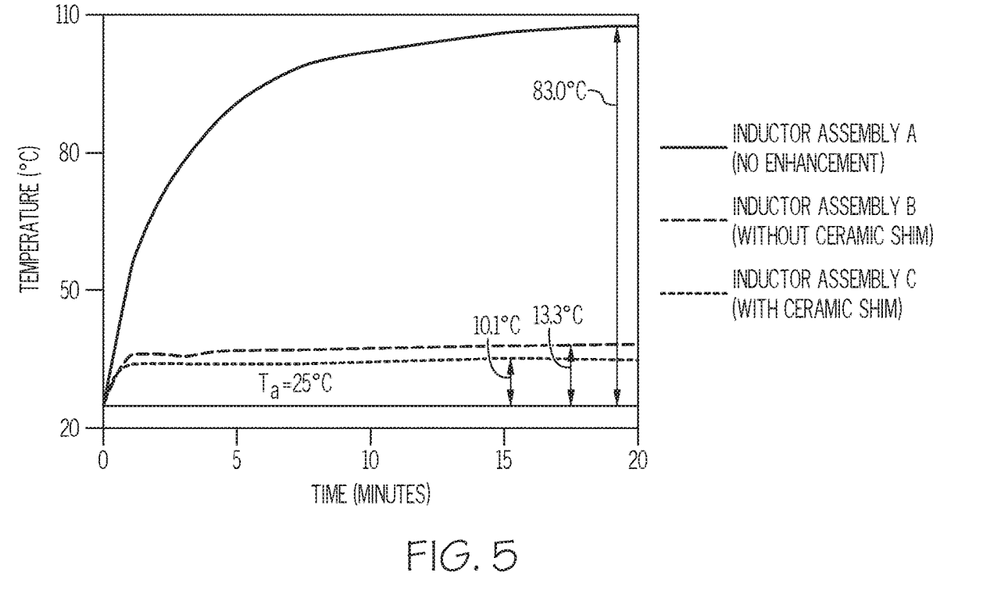
FIG. 5 depicts a graphical comparative plot over time of temperature of (i) a first inductor assembly A with a PCB having an FR-4 shim layer without any thermal vias, (ii) a second inductor assembly B with a PCB having an FR-4 shim layer and thermal vias, and (iii) a third inductor assembly C with a PCB having a ceramic shim layer and thermal vias, when a 30 A DC current is applied at a temperature of 25° C. for a steady power loss density of 1 Watt/cm², according to one or more embodiments shown and described herein.

The implementation of various cooling strategies—the optimally-shaped cold plate 340, the removal of solder mask from the bottom surface 114 of the example PCB 110, and in particular the designed non-uniform distribution of a plurality of thermal vias T in the example PCB 110 as well as the shim layer 220 made of ceramic between the example PCB 110 and the cold plate 340—improve the overall thermal performance of the inductor assembly 100. The improvement in thermal performance was evaluated using three inductor assemblies—(i) a first inductor assembly A with a PCB having an FR-4 shim layer without any thermal vias, (ii) a second inductor assembly B with a PCB having an FR-4 shim layer and thermal vias as discussed above, and (iii) a third inductor assembly C with a PCB having a ceramic shim layer and thermal vias as discussed above. The three inductor assemblies A, B, and C were subject to a 30 A DC current at an ambient temperature $T_a$ of 25° C. The rise in temperature due to the applied current for each of the three inductor assemblies A, B, and C was recorded for a steady power loss density of 1 Watt/cm². FIG. 5 depicts a graphical comparative plot over time of temperature of the three inductor assemblies A, B, and C. As shown in FIG. 5, the temperature of the first inductor assembly A rose by about 83° C., while that of the second inductor assembly B and the third inductor assembly C rose by about 13.3° C. and about 10.1° C. respectively. Thus, the second inductor assembly B and the third inductor assembly C had significantly lower rises in temperature, attributable to the presence of the non-uniform and functionally-graded distribution of the plurality of thermal vias T in the example PCB 110. The third inductor assembly C had the lowest temperature rise attributable to the presence of the ceramic shim, in addition to the plurality of thermal vias T.

Figure 6:
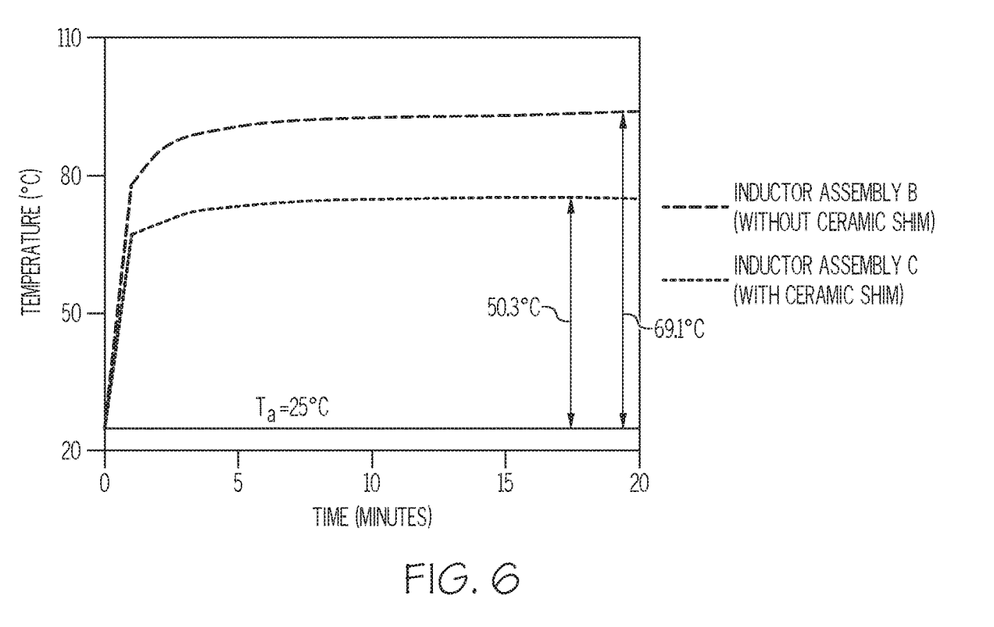
FIG. 6 depicts a graphical comparative plot over time of temperature of (i) the second inductor assembly B and (ii) the third inductor assembly C of FIG. 5, when a 60 A DC current is applied at a temperature of 25° C. for a steady power loss density of 4 Watt/cm², according to one or more embodiments shown and described herein.

The thermal performance of the second inductor assembly B and the third inductor assembly C were further evaluated by applying a 60 A DC current at an ambient temperature, $T_a$ of 25° C. The rise in temperature due to the applied current for the second inductor assembly B and the third inductor assembly C was recorded for a steady power loss density of 4 Watt/cm². FIG. 6 depicts a graphical comparative plot over time of temperature of the two inductor assemblies B and C. As shown in FIG. 6, the temperature of the second inductor assembly B rose by about 69.1° C., while that of the third inductor assembly C rose by about 50.3° C. Thus, the third inductor assembly C had a significantly lower rise in temperature than the second inductor assembly B, attributable to the presence of the ceramic shim.

The apparatuses described herein can be advantageously used for cooling inductor assemblies, such as those used in composite converter systems found in electric vehicles. The designed non-uniform and functionally-graded distribution of the plurality of thermal vias and the ceramic shim layer simplify the configuration of the inductor assembly and eliminate the need for additional or separate cooling apparatuses. Further, the amount and the rate of heat dissipation due to electric current in the inductor assembly can be effectively improved by customizing the shapes and sizes of the cold plate. The temperatures of the PCB-based winding layers in the inductor assembly are thus significantly reduced. Accordingly, through implementation of the thermal management strategies, reliability and operational efficiency of the inductor assembly can be enhanced while reducing natural aging and/or damage.

It is noted that the terms "substantially" and "about" may be utilized herein to include the inherent degree of uncertainty that may be attributed to any quantitative comparison, value, measurement, or other representation. These terms are also utilized herein to represent the degree by which a quantitative representation may vary from a stated reference without resulting in a change in the basic function and intended scope of the subject matter at issue.

While particular embodiments have been illustrated and described herein, it should be understood that various other changes and modifications may be made without departing from the spirit and scope of the claimed subject matter. Moreover, although various aspects of the claimed subject matter have been described herein, such aspects need not be utilized in combination. It is therefore intended that the appended claims cover all such changes and modifications that are within the scope of the claimed subject matter.

What is claimed is:

1. A printed circuit board (PCB) for an inductor assembly comprising:
   a top surface;
   a bottom surface;
   two or more electrically-conductive layers embedded within the PCB and stacked vertically between the top surface and the bottom surface, wherein the two or more electrically-conductive layers are electrically connected to form an inductor winding; and
   a plurality of thermal vias thermally connecting each of the two or more electrically-conductive layers to a cold plate thermally connected to the bottom surface, wherein a number of thermal vias thermally connecting each electrically-conductive layer to the cold plate is directly proportional to a predetermined rate of heat dissipation from the electrically-conductive layer, wherein the predetermined rate of heat dissipation from each electrically-conductive layer is determined to maintain a uniform thermal load profile of the inductor winding.

2. The PCB of claim 1 further comprising a shim layer coupled to the bottom surface of the PCB and thermally connected to the cold plate, wherein the shim layer has a thermal conductivity of at least 20 W/m*K.

3. The PCB of claim 1, wherein a number of thermal vias thermally connecting an electrically-conductive layer relatively proximate to the top surface is greater than a number of thermal vias thermally connecting an electrically-conductive layer relatively proximate to the bottom surface.

4. The PCB of claim 1 further comprising a plurality of electro-thermal vias for electrically and thermally interconnecting the two or more electrically-conductive layers.

5. The PCB of claim 1, wherein the plurality of thermal vias are distributed along one or more edges on the top surface.

6. The PCB of claim 1, wherein the two or more electrically-conductive layers comprises six electrically-conductive layers.

7. The PCB of claim 6, wherein the plurality of thermal vias thermally connect three electrically-conductive layers consecutively proximate to the top surface to the cold plate.

8. An inductor assembly comprising:
a cold plate having a slotted recess;
a first inductor core mounted to the cold plate through the slotted recess along a first end of the first inductor core;
a printed circuit board (PCB) disposed over the cold plate, wherein the PCB further comprises:
  a top surface;
  a bottom surface thermally connected to the cold plate;
  two or more electrically-conductive layers embedded within the PCB and stacked vertically between the top surface and the bottom surface, wherein the two or more electrically-conductive layers are electrically connected to form an inductor winding;
  a plurality of thermal vias thermally connecting each of the two or more electrically-conductive layers to the cold plate, wherein a number of thermal vias thermally connecting each electrically-conductive layer to the cold plate is directly proportional to a predetermined rate of heat dissipation from the electrically-conductive layer; and
  one or more apertures through which a second end of the first inductor core projects outwards from the bottom surface to the top surface, wherein the second end of the first inductor core is opposite to the first end of the inductor core.

9. The inductor assembly of claim 8 further comprising an I-shaped or an E-shaped second inductor core disposed on the second end of the first inductor core.

10. The inductor assembly of claim 8, wherein the cold plate is a thermally-conductive block comprising copper or aluminum.

11. The inductor assembly of claim 8, wherein the PCB comprises six electrically-conductive layers and the plurality of thermal vias thermally connect three electrically-conductive layers consecutively proximate to the top surface to the cold plate.

12. The inductor assembly of claim 8 further comprising a shim layer coupled to the bottom surface of the PCB and thermally connected to the cold plate, wherein the shim layer has a thermal conductivity of at least 20 W/m*K.

13. The inductor assembly of claim 8, wherein the predetermined rate of heat dissipation from each electrically-conductive layer is determined to maintain a uniform thermal load profile of the inductor winding.

14. The inductor assembly of claim 8, wherein a number of thermal vias thermally connecting an electrically-conductive layer relatively proximate to the top surface is greater than a number of thermal vias thermally connecting an electrically-conductive layer relatively proximate to the bottom surface.

15. The inductor assembly of claim 8 further comprising a plurality of electro-thermal vias for electrically and thermally interconnecting the two or more electrically-conductive layers.

16. The inductor assembly of claim 8, wherein the plurality of thermal vias are distributed along one or more edges on the top surface of the PCB.

17. The inductor assembly of claim 8, wherein the first inductor core is E-shaped.

18. The inductor assembly of claim 9, wherein the first inductor core and the second inductor core are separated by an electrically-isolating spacer comprising an electromagnetically neutral material.

19. The inductor assembly of claim 9, wherein the first inductor core and the second inductor core are clamped together with a heat-spreading mechanism to increase the heat flow to the cold plate.

* * * * *